US010224260B2

(12) United States Patent
Ng

(10) Patent No.: US 10,224,260 B2
(45) Date of Patent: Mar. 5, 2019

(54) SEMICONDUCTOR PACKAGE WITH AIR GAP

(71) Applicant: Infineon Technologies AG, Neubiberg (DE)

(72) Inventor: Chee Yang Ng, Muar (MY)

(73) Assignee: Infineon Technologies AG, Neubiberg (DE)

( * ) Notice: Subject to any disclaimer, the term of this patent is extended or adjusted under 35 U.S.C. 154(b) by 618 days.

(21) Appl. No.: 14/090,019

(22) Filed: Nov. 26, 2013

(65) Prior Publication Data

US 2015/0145078 A1   May 28, 2015

(51) Int. Cl.
*H01L 23/31* (2006.01)
*B81C 1/00* (2006.01)
*B81C 99/00* (2010.01)

(52) U.S. Cl.
CPC ........ *H01L 23/315* (2013.01); *B81C 1/00269* (2013.01); *B81C 99/002* (2013.01); *B81C 2203/0109* (2013.01); *H01L 2224/16* (2013.01); *H01L 2924/0002* (2013.01)

(58) Field of Classification Search
CPC ............... H03H 3/08; H03H 9/0585; H03H 9/14502–9/14597; H03H 9/64–9/6496; H03H 9/173; H03H 9/587; B81C 1/00047; B81C 1/00158; B81B 3/0056; B81B 2203/0127; B81B 7/0035; B81B 7/0038; H01L 23/315
See application file for complete search history.

(56) References Cited

U.S. PATENT DOCUMENTS

| 6,011,294 | A | 1/2000 | Wetzel |
| 6,262,513 | B1 * | 7/2001 | Furukawa ............... H01L 21/56 257/E21.502 |
| 7,060,530 | B2 * | 6/2006 | Kanatake ................ H01L 21/50 257/788 |

(Continued)

FOREIGN PATENT DOCUMENTS

| CN | 101517718 A | 8/2009 |
| CN | 102365540 A | 2/2012 |

(Continued)

OTHER PUBLICATIONS

Feiertag, G. et al. "Packaging of MEMS Microphones." Proc. SPIE 7362, Smart Sensors, Actuators, and MEMS IV, May 2009, pp. 1-8, vol. 7362, Dresden, Germany.

*Primary Examiner* — Jose R Diaz
(74) *Attorney, Agent, or Firm* — Murphy, Bilak & Homiller, PLLC

(57) ABSTRACT

A semiconductor package includes a semiconductor die having a first main side and a second main side opposite the first main side, the first main side having an inner region surrounded by a periphery region. The semiconductor package further includes a film covering the semiconductor die and adhered to the periphery region of the first main side of the semiconductor die. The film has a curved surface so that the inner region of the first main side of the semiconductor die is spaced apart from the film by an air gap. Electrical conductors are attached at a first end to pads at the periphery region of the first main side of the semiconductor die. A corresponding method of manufacture is also provided.

15 Claims, 7 Drawing Sheets

(56) References Cited

U.S. PATENT DOCUMENTS

| | | | |
|---|---|---|---|
| 7,291,547 B2* | 11/2007 | Timme | H03H 3/02 257/704 |
| 7,798,497 B2 | 9/2010 | Wagner et al. | |
| 8,222,970 B2* | 7/2012 | Inoue | H03H 3/04 310/324 |
| 8,242,569 B2* | 8/2012 | Rothacher | B81C 1/00269 257/415 |
| 2003/0132517 A1* | 7/2003 | Matsuta | H03H 9/0585 257/706 |
| 2004/0207033 A1* | 10/2004 | Koshido | H03H 3/08 257/415 |
| 2004/0259330 A1 | 12/2004 | Fujii et al. | |
| 2008/0286562 A1* | 11/2008 | Toyoda | C09J 163/00 428/327 |
| 2009/0001599 A1 | 1/2009 | Foong et al. | |
| 2010/0275675 A1 | 11/2010 | Seppa et al. | |
| 2010/0295140 A1 | 11/2010 | Theuss et al. | |
| 2011/0018389 A1* | 1/2011 | Fukano | H03H 9/059 310/313 R |
| 2011/0036174 A1 | 2/2011 | Hooper et al. | |
| 2011/0241197 A1 | 10/2011 | Theuss | |
| 2012/0238058 A1 | 9/2012 | Luo et al. | |
| 2015/0326147 A1* | 11/2015 | Shimizu | H02N 2/123 310/323.15 |

FOREIGN PATENT DOCUMENTS

| | | |
|---|---|---|
| CN | 102683223 A | 9/2012 |
| EP | 1753023 A2 | 2/2007 |

\* cited by examiner

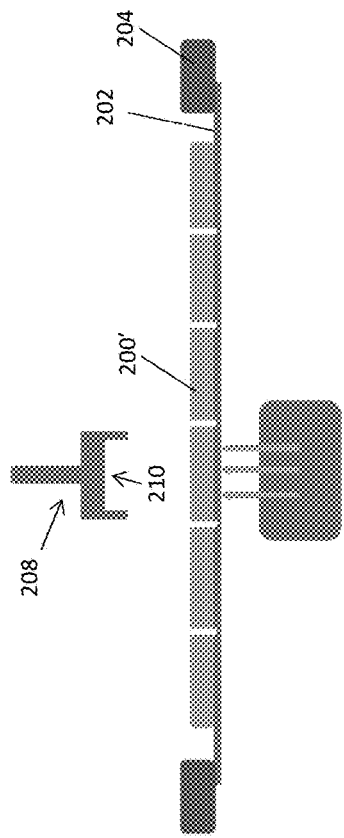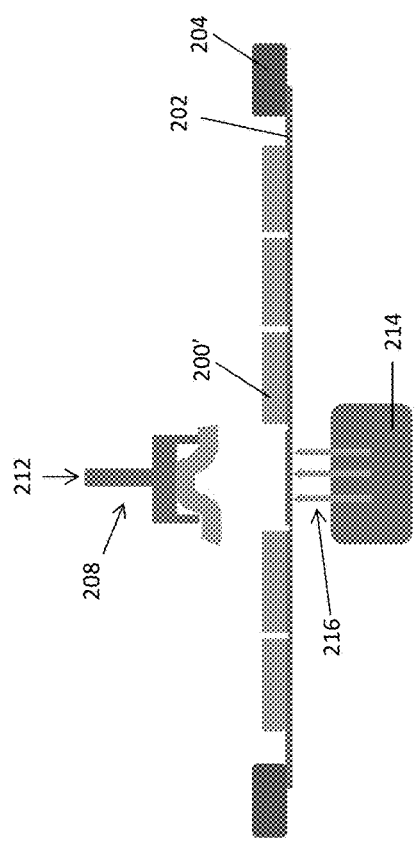

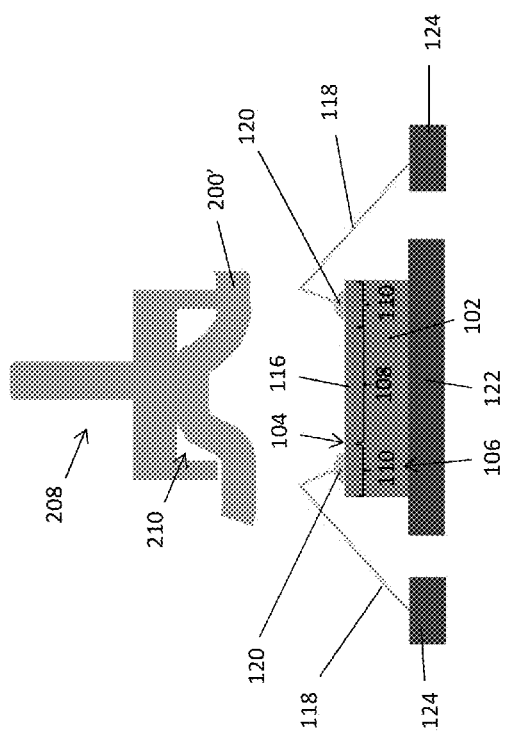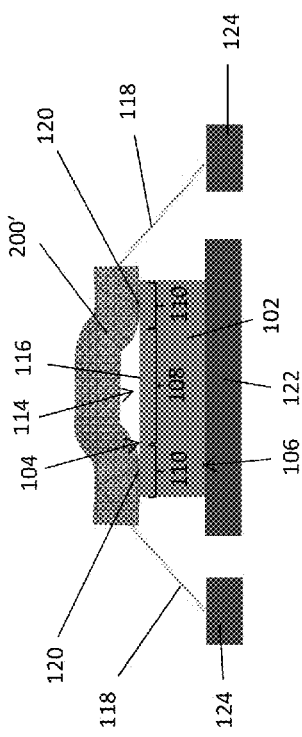
Figure 2F
Figure 2G

SEMICONDUCTOR PACKAGE WITH AIR GAP

TECHNICAL FIELD

The instant application relates to packaging of semiconductor dies, and more particularly to packaging of semiconductor dies having a sensitive surface.

BACKGROUND

The surface acoustic wave (SAW) phenomenon has been used to implement filtering in electronic applications. SAW filters include a piezoelectric substrate such as quartz or gallium arsenide (GaAs) and interdigitated transducers formed by photolithographic patterning of a thin metal layer. Application of an alternating voltage to the input transducer generates an alternating strain field that launches a surface acoustic wave that travels along the substrate surface before being converted back into an electrical signal by the output transducer. The velocity and attenuation of the propagating wave are very sensitive to properties, such as mass and viscoelasticity, of thin films formed on the device surface.

SAW filters are used in various applications such as mobile telephones, and provide significant advantages in performance, cost and size over other filter technologies such as quartz crystals (based on bulk waves), LC filters and waveguide filters. The surface of a SAW filter must be kept free of contacts and foreign materials to ensure surface waves are generated freely according to the incoming radio frequency. An air gap of at least a few microns is typically needed for SAW filters to function properly. Conventional SAW filters include a separator such as a carrier or liquid cell based on photo-definable epoxy SU-8 on the piezoelectric substrate. A lid is bonded to the separator to protect the separator during subsequent processing such as molding. The separator ensures a sufficient air gap exists between the surface of the SAW filter and the lid, keeping the SAW filter surface free of contacts and foreign materials.

However, the separator and lid increase the overall cost of SAW filter packages. The processing cost involved with placing the separator on the SAW filter, preparing the lid and bonding the lid to the separator further adds to the overall cost. The combined thickness of the separator and lid is typically at least 200 µm, substantially increasing the thickness of the final SAW filter package which is disadvantageous considering substantial industry pressure to reduce the size of packaged components. In addition, only a small space is available between the edge of the separator and the edge of the SAW filter die for attaching wire bonds. Reverse bonding techniques are often required to attach the wire bonds in this case. Reverse bonding techniques are not well adapted for Cu bond wires and also add to the complexity of the wire bond process.

SUMMARY

According to an embodiment of a semiconductor package, the package comprises a semiconductor die having a first main side and a second main side opposite the first main side, the first main side having an inner region surrounded by a periphery region. The semiconductor package further comprises a film covering the semiconductor die and adhered to the periphery region of the first main side of the semiconductor die. The film has a curved surface so that the inner region of the first main side of the semiconductor die is spaced apart from the film by an air gap. Electrical conductors are attached at a first end to pads at the first or second main side of the semiconductor die.

According to an embodiment of a method of manufacturing a semiconductor package, the method comprises: conforming a segment of an adhesive film to a surface contour of a cavity of a pickup tool; positioning the pickup tool with the segment of adhesive film over a semiconductor die having a first main side and a second main side opposite the first main side, the first main side having an inner region surrounded by a periphery region; and adhering the segment of adhesive film to the periphery region of the first main side of the semiconductor die while the segment of adhesive film conforms to the surface contour of the pickup tool, so that the segment of adhesive film has a curved surface corresponding to the surface contour of the pickup tool and the inner region of the first main side of the semiconductor die is spaced apart from the segment of adhesive film by an air gap.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes FIGS. 2A through 2G, illustrates different stages of an embodiment of a method of a manufacturing a semiconductor package with an air gap.

FIG. 3, which includes

FIG. 4, which includes

DETAILED DESCRIPTION

According to embodiments described herein, a semiconductor package is provided that includes a semiconductor die having a sensitive structure such as a pressure sensor diaphragm, SAW filter transducers, MEMS components (microelectromechanical systems, or also commonly referred to as micro-machines or micro-systems technology), etc. disposed at a main side of the die. The periphery (outer) region of this side of the die is free of the sensitive structure, and includes pads which provide points of external electrical contact for the die. A film is provided that covers the semiconductor die and is adhered to the periphery region of the side of the die with the sensitive structure. The film has a curved (contoured) surface i.e. any curved surface or feature differing from a straight line, so that the sensitive structure of the die is spaced apart from the film by an air gap. The air gap enabled by the film keeps the sensitive structure of the die free from contacts and foreign materials and eliminates the need for an additional separator and lid.

Figure 1:
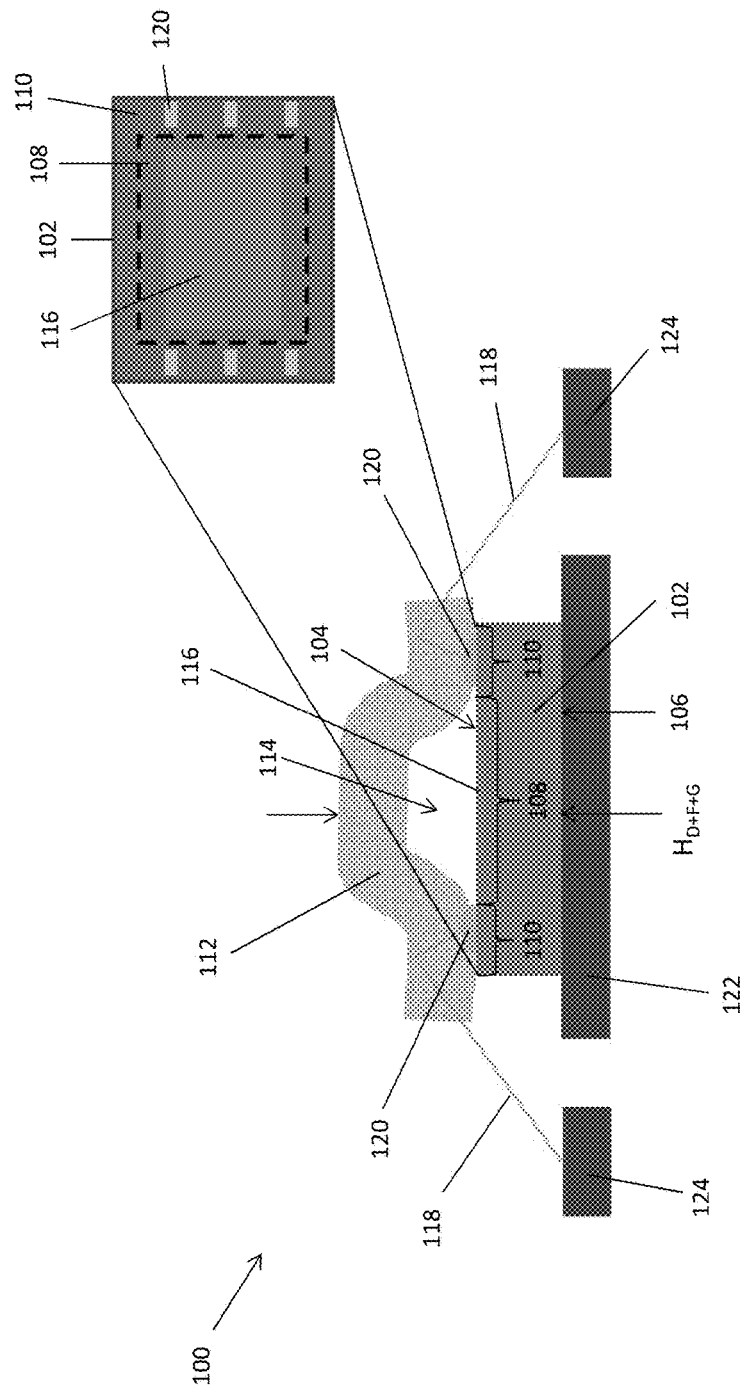
FIG. 1 illustrates a cross-sectional view of an embodiment of a semiconductor package with an air gap.

FIG. 1 illustrates a cross-sectional view of an embodiment of a semiconductor package 100 including a semiconductor die 102. FIG. 1 also shows a top plan view of the semiconductor die 102. The semiconductor die 102 has a first main side 104 and a second main side 106 opposite the first main side 104. The first main side 104 of the die 102 has an inner region 108 surrounded by a periphery region 110. A film 112 covers the semiconductor die 102 and is adhered to the periphery region 110 of the first main side 104 of the semiconductor die 102. The film 112 has a curved surface so that the inner region 108 of the first main side 104 of the semiconductor die 102 is spaced apart from the film 112 by an air gap 114. In one embodiment, the air gap 114 between the inner region 108 of the first main side 104 of the semiconductor die 102 and the film 112 is at least 10 µm at the widest point of the gap 114. In one embodiment, a total height ($H_{D+F+G}$) of the semiconductor package 100 including the semiconductor die 102, the film 112 and the air gap 114 is between 150 µm and 200 µm. This represents at least a 100 µm reduction in the package height compared to conventional semiconductor packages with an air gap realized by a separator and lid.

The semiconductor die 102 has a structure 116 disposed at the first main side 104 of the die 102 that is sensitive to contacts and foreign materials. In one embodiment, the semiconductor die 102 is a SAW filter die and the sensitive structure 116 includes transducers of a SAW filter. In this case, the air gap 114 is between the SAW filter transducers of the sensitive structure 116 and the film 112.

In another embodiment, the semiconductor die 102 is a pressure sensor die and the sensitive structure 116 disposed at the first main side 104 of the die 102 includes a diaphragm of a pressure sensor. In this case, the air gap 114 is between the pressure sensor diaphragm of the sensitive structure 116 and the film 112.

In yet another embodiment, the semiconductor die 102 is a MEMS die and the sensitive structure 116 disposed at the first main side 104 of the die 102 includes components of a MEMS device. In this case, the air gap 114 is between the MEMS components of the sensitive structure 116 and the film 112. In still other embodiments, yet a different type of structure 116 sensitive to contacts and foreign materials is disposed at the first main side 104 of the die 102. In each case, the film 112 protects the sensitive structure 116 of the semiconductor die 102 during subsequent processing which can include a molding process.

Electrical connections can be made to the first main side 104 the semiconductor die 102 through the film 112. More particularly, electrical conductors 118 such as bond wires, ribbons or clips can be provided and attached at a first end to pads 120 at the periphery region 110 of the first main side 104 of the semiconductor die 102. The pads 120 provide points of external electrical contact for the die 102. The second main side 106 of the die 102 can be attached to a substrate 122. The substrate 122 can be electrically conductive or insulative depending on the type of device. For example, the substrate 122 can be ceramic with or without metallization depending on whether one or more terminals are provided at the second main side 106 of the die 102 e.g. in the case of a vertical device where current flows vertically between the first and second main sides 104, 106 of the die 102. In another example, the substrate 122 is a die paddle of a lead frame. Still other types of standard substrates can be used. Leads 124 are attached to the second end of the electrical conductors 118 and provide points of external electrical contact for the semiconductor package 100.

The film 112 has sufficient rigidity after being adhered to the periphery region 110 of the first main side 104 of the semiconductor die 102 so that the air gap 116 between the inner region 108 of the first main side 104 of the die 102 and the film 112 remains intact after subsequent processing of the semiconductor package 100. For example, the package 100 can be molded which is typically performed at a temperature of about 175 degrees C. The film 112 is selected so that it does not collapse and eliminate the gap 116 during the molding process.

In one embodiment, the film 112 comprises an at least partly cured flow-over-wire (FOW) adhesive film. FOW films are formulated to incorporate the properties of die-attach films and dicing tape into one product. Rheological properties are modified to allow a resin to flow over and encapsulate the conductors 118. FOW materials typically use the same base chemistries as die attach film (DAF), which are based on epoxies and polyimides, but formulations are optimized for proper B-stage, flow and wetting around wires. FOW materials are designed to flow over wire bonds or other electrical conductors 118 connected to a semiconductor die 102, securely embedding and sealing the conductors 118 in an adhesive layer along the periphery region 110 of the first main side 104 of the semiconductor die 102. For no-cure FOW materials, a support wafer can be laminated onto the FOW film, diced, and then the die are picked and placed. The stack moves to wire bonding and then on to molding. Alternatively, a cure step can be added by using an FOW cure material. For example, a standard quick-cure FOW offers the ability to cure inline during wire bonding with no separate oven cure step required, as it can cure within 10 minutes at 175 degrees C. The FOW materials also can be cured during a molding process if the wire bonding is performed prior to application of the film 112 to the die 102. The elastic modulus of FOW materials after curing at molding temperature (e.g. 175 degrees C.) is about 1000 MPa. The compact pressure of the mold is only about 8 MPa, meaning that the FOW material maintains its shape during the molding process and the air gap 116 is preserved between the inner region 108 of the first main side 104 of the semiconductor die 102 and the film 112.

In another embodiment, the film 112 comprises an at least partly cured thermoset material. A thermoset is a polymer material that irreversibly cures and can be molded into any desired form. In yet another embodiment, the film 112 is a silicon film. In each case, the material of the film 112 has a low enough elastic modulus in order to form a curved surface. By curving the surface of the film 112 and preserving the curved shape during subsequent processing of the semiconductor package 100, the air gap 116 is preserved between the inner region 108 of the first main side 104 of the semiconductor die 102 and the film 112.

Figure 2A:
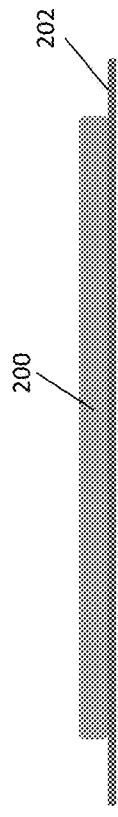
Figure 2B:
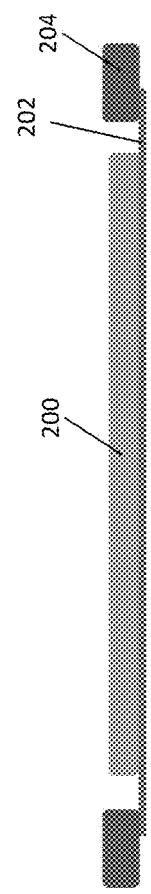
Figure 2C:
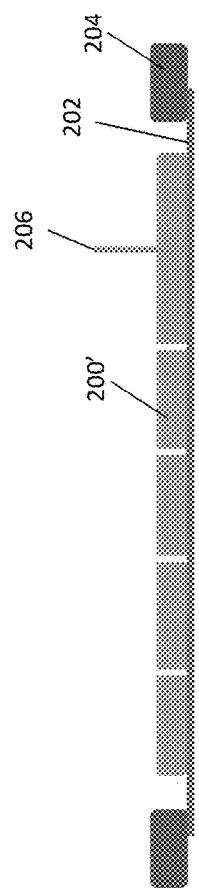

FIG. 2, which includes FIGS. 2A through 2G, illustrates an embodiment of a method of manufacturing the semiconductor package 100 with the air gap 116. FIG. 2 shows cross-sectional views of the package 100 during different stages of manufacture.

FIG. 2A shows an adhesive film 200 provided on a carrier 202. The adhesive film 200 can comprise an FOW adhesive film, a thermoset film or a silicon film as previously described herein, or any other suitable type of adhesive film that can be curved or shaped under pressure. Any standard carrier 202 such a foil can be used to support the adhesive film 200.

FIG. 2B shows the carrier 202 mounted to a wafer ring 204 for additional support.

FIG. 2C shows the adhesive film 200 during segmentation into individual segments of adhesive film 200'. The adhesive film 200 can be segmented using any standard film cutting approach 206, including by sawing, laser cutting, etc.

FIG. 2D shows the adhesive film 200 during a pickup process. A standard pickup tool 208 is provided. The pickup tool 208 has an open cavity 210 facing the carrier 202 with the adhesive film 200. The pickup tool 208 can move in the x-y (lateral) direction to align with different ones of the adhesive film segments 200'. The pickup tool 208 can also move in the z (vertical) direction to pick up different ones of the adhesive film segments 200'. By moving the pickup tool 208 in the vertical direction toward one of the adhesive film segments 200', the pickup tool 208 contacts that film segment 200' so that the cavity 210 of the pickup tool 208 is disposed over the segment of adhesive film 200'.

FIG. 2E shows one of the adhesive film segments 200' being picked up by the pickup tool 208, by applying a vacuum through an opening 212 in the cavity 210 that pulls the segment of adhesive film 200' into the cavity 210. The vacuum is of sufficient magnitude to cause the segment of adhesive film 200' to conform to the surface contour of the cavity 210 of the pickup tool 208, curving the surface of the film segment 200'. In the case of a relatively flexible film 200 such as FOW or thermoset materials which typically have an elastic modulus of about 1 GPa or less at room temperature, a lower vacuum force can be used to conform the segment of adhesive film 200' to the surface contour of the cavity 210 of the pickup tool 208. In the case of less flexible films 200 such as silicon films which typically have an elastic modulus of above 1 GPa (e.g. about 170 GPa for silicon films) at room temperature, a higher vacuum force is used to conform the film segment 200' to the cavity 210. Even relatively stiff films 200 such as silicon films can bend under cavity tool suction force provided by standard pickup tools, and thus should also conform to the surface contour of the cavity 210 of the pickup tool 208.

An additional tool 214 can be provided at the opposite side of the adhesive film 200 as the pickup tool 208 for aiding in the film pickup process, as shown in FIGS. 2D and 2E. The additional tool 214 can move in the x-y (lateral) direction below the carrier 202 to align with different ones of the adhesive film segments 200'. The additional tool 214 can also move in the z (vertical) direction to press against the backside of the carrier 202. For example, the additional tool 214 can include needles or other similar structures 216 which extend toward the backside of the carrier 202. The needles 216 press against the backside of the carrier 202 which in turn presses against the side of the individual segments of adhesive film 200' opposite the pickup tool 208, so that the segments of adhesive film 200' remain relatively flat during ejection from the carrier 202. The carrier 202 is flexible in this case.

FIG. 2F shows the pickup tool 108 with one of the segments of adhesive film 200' being positioned over the semiconductor die 102. The vacuum is still applied to the pickup tool 208 so that the segment of adhesive film 200' remains contoured to the shape of the cavity 210 of the pickup tool 208. The electrical conductors 118 have already been attached at one end to the leads 124 and at the opposing end to the pads 120 at the periphery 110 of the first main side 104 of the die 102. The second main side 106 of the die 102 has also been attached to a substrate 122 according to this embodiment. This way, the segment of adhesive film 200' is not subjected to excessive temperatures associated with wire bond and die attach processes. Alternatively, the segment of adhesive film 200' can be adhered to the periphery 110 of the die 102 after the wire bond and die attach processes if capable of withstanding these temperatures.

For films 200 that require at least partial curing to maintain the curved shape imparted by the cavity 210 of the pickup tool 208, the assembly is heated to at least partly cure the segment of adhesive film 200' while it conforms to the surface contour of the cavity 210 of the pickup tool 208. In the case of FOW materials, heating also causes the FOW material to flow over and encapsulate the conductors 118 attached to the pads 120 at the periphery 110 of the first main side 104 of the semiconductor die 102 as shown in FIG. 2G. This way, the die pads 120 and the ends of the conductors 118 attached to the die pads 120 are protected by the segment of adhesive film 200'.

The temperature treatment also causes the segment of adhesive film 200' to adhere to the periphery region 110 of the first main side 104 of the semiconductor die 102. Also, the segment of adhesive film 200' remains under vacuum and therefore has a curved surface corresponding to the surface contour of the cavity 210 of the pickup tool 208. By curving the surface of the adhesive film segment 200' in this way, an air gap 114 is provided between the inner region 108 of the first main side 104 of the semiconductor die 102 and the segment of adhesive film 200' as shown in FIG. 2G. The air gap 114 protects any sensitive structures 116 such as a pressure sensor diaphragm, SAW filter transducers or MEMS components disposed in the inner region 108 of the first main side 104 of the die 102 during subsequent processing as previously described herein.

Figures 3A, 3B, 3C, 3D:
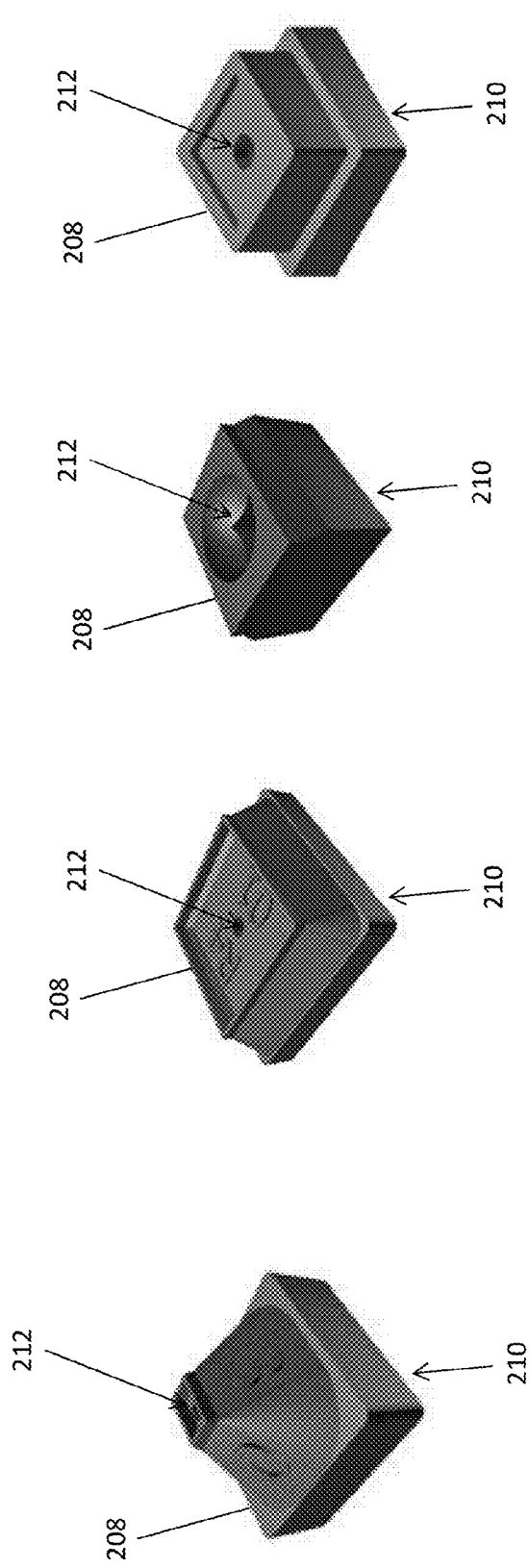
FIGS. 3A through 3D, illustrates different embodiments of pickup tools with open cavities for vacuum shaping an adhesive film used to form an air gap in a semiconductor package.

FIG. 3, which includes FIGS. 3A through 3D, illustrates different embodiments of the pickup tool 208. The pickup tool 208 can have different shapes and dimensions so that the cavity 210 of the pickup tool 208 can also have different shapes and dimensions as shown in FIGS. 3A through 3D. This way, the design of the pickup tool 208 can be tailored to the dimensions and layout of the semiconductor dies 102 to which films 112/200 are to be directly adhered. Different dies 102 can be accommodated by simply changing pickup tools 208. In each case, the film 112/200 used to protect sensitive structures 116 at a main side 104 of the dies 102 conforms to the surface contour of the cavity 210 of whichever pickup tool 208 is selected so that an air gap 114 is formed between the films 112/200 and the sensitive structures 116.

Figure 4B:
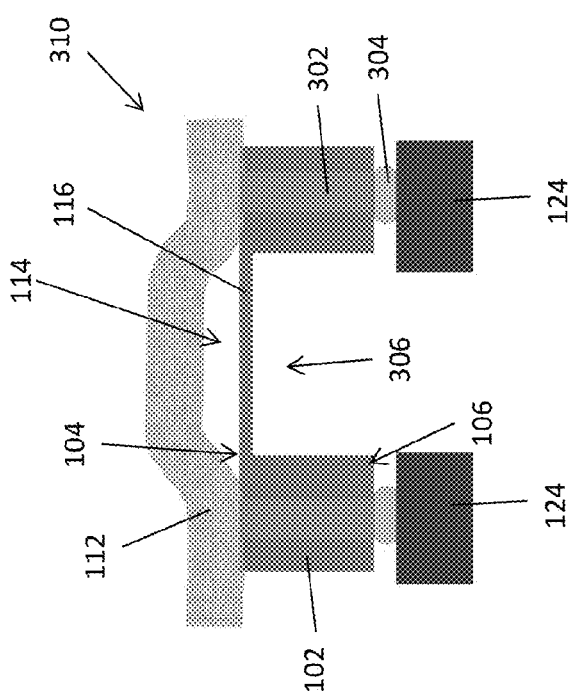
FIGS. 4A through 4C, illustrates different embodiments of a semiconductor package with an air gap and having a flip-chip configuration.
Figure 4A:
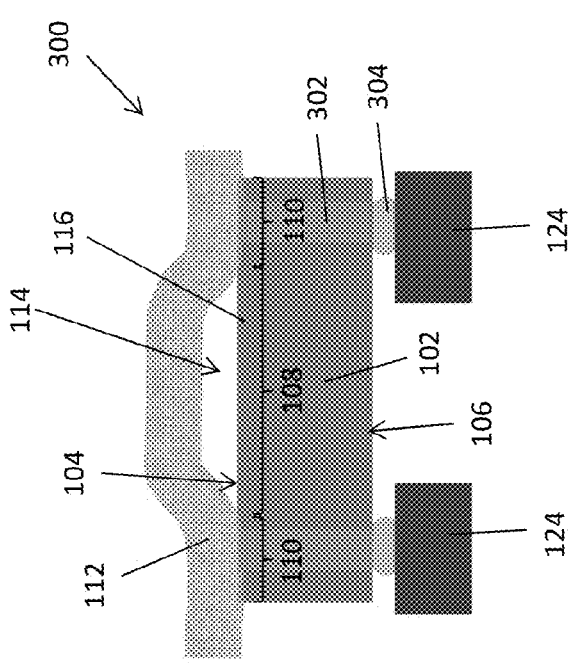
Figure 4C:
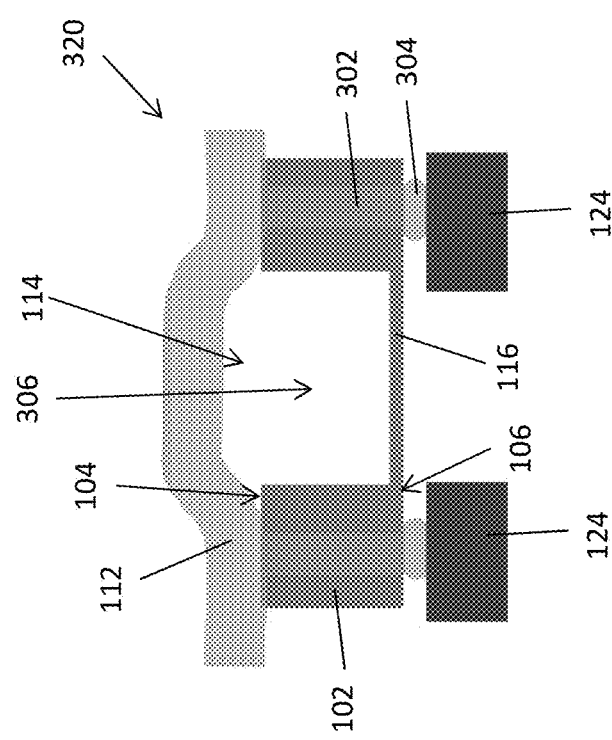

FIG. 4, which includes FIGS. 4A through 4C, shows additional embodiments of semiconductor packages 300, 310, 320 including a semiconductor die 102 and a film 112 with a curved surface so that the sensitive structure 116 of the die 102 is protected by an air gap 114 provided by the film 112. The sensitive structure 116 can include e.g. transducers of a SAW filter, a diaphragm of a pressure sensor, MEMS components, or any other structure which is sensitive to contacts and foreign materials. The film 112 protects the sensitive structure 116 of the semiconductor die 102 during subsequent processing which can include a molding process, as previously described herein.

The semiconductor packages 300, 310, 320 shown in FIG. 4 have a flip-chip or other vertical electrical connection configuration e.g. including through-silicon vias 302 and electrical conductors 304 such as solder which vertically connect the semiconductor die 102 to leads 124. With the package 300 of FIG. 4A, the semiconductor die 102 is devoid of a hollow cavity and the sensitive structure 116 of the die 102 is disposed at the first main side 104 of the die 102. With the package 310 of FIG. 4B, the semiconductor die 102 has a hollow cavity 306 disposed below the sensitive structure 116 at the first main side 104 of the die 102. With the package 320 of FIG. 4C, the sensitive structure 116 of the semiconductor die 102 is disposed at the second main side 106 of the die 102 and the hollow cavity 306 in the die 102 is interposed between the sensitive structure 116 and the film 112. In each case, the sensitive structure 116 of the semiconductor die 102 is spaced apart from the film 112 by an air gap 114 to protect the sensitive structure 116.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
a semiconductor die having a first main side and a second main side opposite the first main side, the first main side having an inner region surrounded by a periphery region;
a film covering the semiconductor die and adhered to the periphery region of the first main side of the semiconductor die, the film having a curved surface so that the inner region of the first main side of the semiconductor die is spaced apart from the film by an air gap and the periphery region of the first main side of the semiconductor die contacts the film; and
electrical conductors attached at a first end to pads at the first main side of the semiconductor die,
wherein the film covers the pads at the periphery region of the first main side of the semiconductor die,
wherein the film comprises a single continuous structure with outer portions contacting the periphery region, curved portions adjoining the outer portions and curving away from the first main side, and a bridge portion extending between the curved portions and being spaced apart from the first main side.

2. The semiconductor package of claim 1, wherein the semiconductor die comprises a SAW (surface acoustic wave) filter with transducers disposed at the first or second main side of the die, and wherein the air gap is between the transducers and the film.

3. The semiconductor package of claim 1, wherein the semiconductor die comprises a pressure sensor with a diaphragm disposed at the first or second main side of the die, and wherein the air gap is between the diaphragm and the film.

4. The semiconductor package of claim 1, wherein the film comprises an at least partly cured flow-over-wire adhesive film.

5. The semiconductor package of claim 1, wherein the film comprises an at least partly cured thermoset material.

6. The semiconductor package of claim 1, wherein the film comprises silicon.

7. The semiconductor package of claim 1, wherein the electrical conductors are embedded in the film along the periphery region of the first main side of the semiconductor die.

8. The semiconductor package of claim 1, further comprising:
a substrate attached to the second main side of the semiconductor die; and
leads attached to a second end of the electrical conductors.

9. The semiconductor package of claim 1, wherein a total height of the semiconductor package including the semiconductor die, the film and the air gap is between 150 µm to 200 µm.

10. The semiconductor package of claim 1, wherein the air gap between the inner region of the first main side of the semiconductor die and the film is at least 10 µm at a widest point of the gap.

11. The semiconductor package of claim 1, wherein the film has a substantially uniform thickness throughout an area above the inner region.

12. The semiconductor package of claim 11, wherein the first and second ends of the single continuous structure overhang past outer edge sides of the semiconductor die.

13. The semiconductor package of claim 1, wherein the film comprises a single non-metallic film.

14. The semiconductor package of claim 1, wherein the single continuous structure has a substantially uniform thickness from a first end to a second end.

15. The semiconductor package of claim 1, wherein the single continuous structure comprises an inner surface that faces the semiconductor die and an outer surface that faces away from the semiconductor die, and wherein the inner surface and the outer surface curve in the same direction in the curved portions.

* * * * *